(12) United States Patent  (10) Patent No.: US 6,426,891 B1
Katori  (45) Date of Patent: Jul. 30, 2002

(54) NONVOLATILE MEMORY WITH A TWO-TERMINAL SWITCHING ELEMENT AND ITS DRIVING METHOD

(75) Inventor: Kenji Katori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/697,207

(22) Filed: Oct. 26, 2000

(30) Foreign Application Priority Data

Oct. 27, 1999 (JP) ............................................. 11-305518

(51) Int. Cl.[7] .............................................. G11C 11/36
(52) U.S. Cl. ......................... 365/175; 365/161; 365/163
(58) Field of Search ................................. 365/115, 113, 365/117, 161, 163, 145, 149, 171, 175, 105

(56) References Cited

U.S. PATENT DOCUMENTS

| | | | | |
|---|---|---|---|---|
| 5,335,219 A | * | 8/1994 | Ovshinsky et al. | ......... 369/288 |
| 6,114,713 A | * | 9/2000 | Zahorlk | ........................... 257/4 |
| 6,118,135 A | * | 9/2000 | Gonzalez et al. | ............... 257/3 |
| 6,189,582 B1 | * | 2/2001 | Reinberg et al. | ............. 143/239 |
| 6,275,411 B1 | * | 8/2001 | Daughton et al. | ........... 365/158 |
| 6,285,581 B1 | * | 9/2001 | Tehrani et al. | ............... 365/173 |

* cited by examiner

Primary Examiner—David Nelms
Assistant Examiner—Gene N. Auduong
(74) Attorney, Agent, or Firm—Sonnenschein, Nath & Rosenthal

(57) ABSTRACT

In nonvolatile memory capable of erasing, writing and reading data, simplified in structure of memory cells, and enabling high-density information recording, each memory cell is composed of a thin film phase change material having two stable phases, "high-temperature phase" and "low-temperature phase" under the room temperature, and an np junction made by a $p^+$-type region and an $n^+$-type region, serially connected to the thin film phase change material. By applying a predetermined voltage to the upper electrode and the lower electrode to have a current flow in a memory cell ($MC_{1j}$) and change the phase of the thin film phase change material, data is written. By flowing a current in the memory cell ($M_{1j}$) and thereby reading the current phase of the thin film phase change material, data is read out.

9 Claims, 8 Drawing Sheets

NONVOLATILE MEMORY WITH A TWO-TERMINAL SWITCHING ELEMENT AND ITS DRIVING METHOD

RELATED APPLICATION DATA

The present application claims priority to Japanese Applications No. P11-305518 filed Oct. 27, 1999, which application is incorporated herein by reference to the extent permitted by law.

BACKGROUND OF THE INVENTION

1. Field of the Invention

This invention relates to nonvolatile memory and its driving method.

2. Description of the Related Art

Heretofore known as nonvolatile solid-state memory are flash memory and FeRAM, for example. Any of them requires three to four terminal for each information recording cell. In a structure connecting a number of terminals to each cell, the space for wirings degrades the integrating density. That is, in favor of increasing the integration density, it is necessary to enable reading of records by using simple cells with less terminals.

For the purpose of high-density recording of information, it is more advantageous to connect less terminals to each cell. For example, for accessing to solid-state memory, the minimum number of terminals is two.

However, conventional memory using two terminals involved not only the problem of disturbance in which writing into a selected cell undesirably influences non-selected cells but also the problem writing and reading could not stand together.

OBJECTS AND SUMMARY OF THE INVENTION

It is therefore an object of the invention to provide nonvolatile memory and its driving method capable of erasing, writing and reading records, simplifying the configuration of memory, and capable of high-density recording of information.

According to the first aspect of the invention, there is provided nonvolatile memory comprising a thin film phase change material having at least two stable phases, and a two-terminal switching element serially connected to the thin film phase change material.

In the first aspect of the invention, the thin film phase change material is typically configured to be changeable in phase when a voltage not lower than the threshold voltage of the two-terminal switching element is applied a current flows into the memory cell by applying a voltage not lower than the two-terminal switching element. This nonvolatile memory according to the first aspect of the invention can write information into the memory cell by changing the phase of the thin film phase change material.

In the first aspect of the invention, the thin film phase change material is typically configured to vary in electric resistance in response to its change in phase. Preferably, by supplying the memory cell with a voltage not lower than the threshold value of the two-terminal switching element, information can be read from the memory cell with reference to a difference in current flowing in the thin film phase change material.

According to the second aspect of the invention, there is provided nonvolatile memory comprising:

lower electrodes aligned in form of stripes; and
upper electrodes aligned in form of stripes such that lengthwise directions thereof intersect substantially at a right angle with lengthwise directions of said lower electrodes,
 in portions between said upper electrodes and said lower electrodes where both electrodes intersect, memory cells each made of a thin film phase change material having at least two stable phases, a conductive adiabatic layer and a two-terminal switching element serially connected thereto.

In the second aspect of the invention, a plurality of layers of nonvolatile memory are preferably stacked, in which each nonvolatile memory has memory cells each including lower electrodes aligned in form of stripes, and upper electrodes aligned in form of stripes such that lengthwise directions thereof intersect substantially at a right angle with lengthwise directions of said lower electrodes, a voltage being applicable to said memory cells through said upper electrodes and said lower electrodes. Thus, in the nonvolatile memory having the multi-layered structure, the upper electrodes of the first nonvolatile memory are commonly used as the lower electrodes of the second nonvolatile memory stacked on the first nonvolatile memory.

In the first and second aspect of the invention, each two-terminal switching element is made of a pn junction or a np junction. Still in the first and second aspects of the invention, each two-terminal switching element typically has a pn junction or an np junction made of a p-type thin film semiconductor and an n-type thin film semiconductor. More specifically, the two-terminal switching element is an np junction or a pn junction made of a p-type thin film semiconductor and an n-type thin film semiconductor. In the first and second aspects of the invention, when an np junction is used as the two-terminal switching element and a reverse bias is applied to the np junction, the threshold voltage of the two-terminal switching element is a breakdown voltage.

In the first and second aspects of the invention, typically used as the two-terminal switching element is an element that decreases its electric resistance when a voltage above the threshold voltage is applied. In order to well control writing of information into the nonvolatile memory, an element that suddenly decreases its electric resistance upon application of a voltage above the threshold value is used as the two-terminal switching element.

According to the third aspect of the invention, there is provided a method for driving nonvolatile memory including lower electrodes aligned in form of stripes;

upper electrodes aligned in form of stripes such that lengthwise directions thereof intersect substantially at a right angle with lengthwise directions of said lower electrodes; and memory cells each made of a thin film phase change material having at least two stable phases, a conductive adiabatic layer and a two-terminal switching element serially connected thereto and located in one of portions between said upper electrodes and said lower electrodes where both electrodes intersect, characterized in that:
 in a writing process, data is written in a selected memory cell by applying a voltage above the total value of the threshold voltage of each said two-terminal switching element and the voltage capable of changing the phase of said thin film phase change material between to one of said upper electrodes and one of said lower electrodes connected to the selected memory cell and thereby changing said thin film phase change material in phase, and in a reading process, data is read out by applying a voltage not lower than said threshold voltage and lower than the total value of said threshold voltage and said voltage capable of changing the phase of said thin film phase change material, and thereby reading the current phase of said thin film phase change material.

Although Japanese Patent Publication No. 2743980 and Japanese Patent Publication No. 2806660 propose methods for easily writing information without using transistors. These publications, however, do not teach any method for reading and do not teach any method for preventing the problem of disturbance during writing or reading operation.

According to the nonvolatile memory according to the invention summarized above, since it includes memory cells each made of a thin film phase change material having at least two stable phases under the room temperature and a two-terminal switching element connected to the thin film phase change material, the current flowing in the thin film phase change material can be controlled by using the two-terminal switching element, and by using this current, it is possible to change the phase of the thin film phase change material and read out its current phase.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
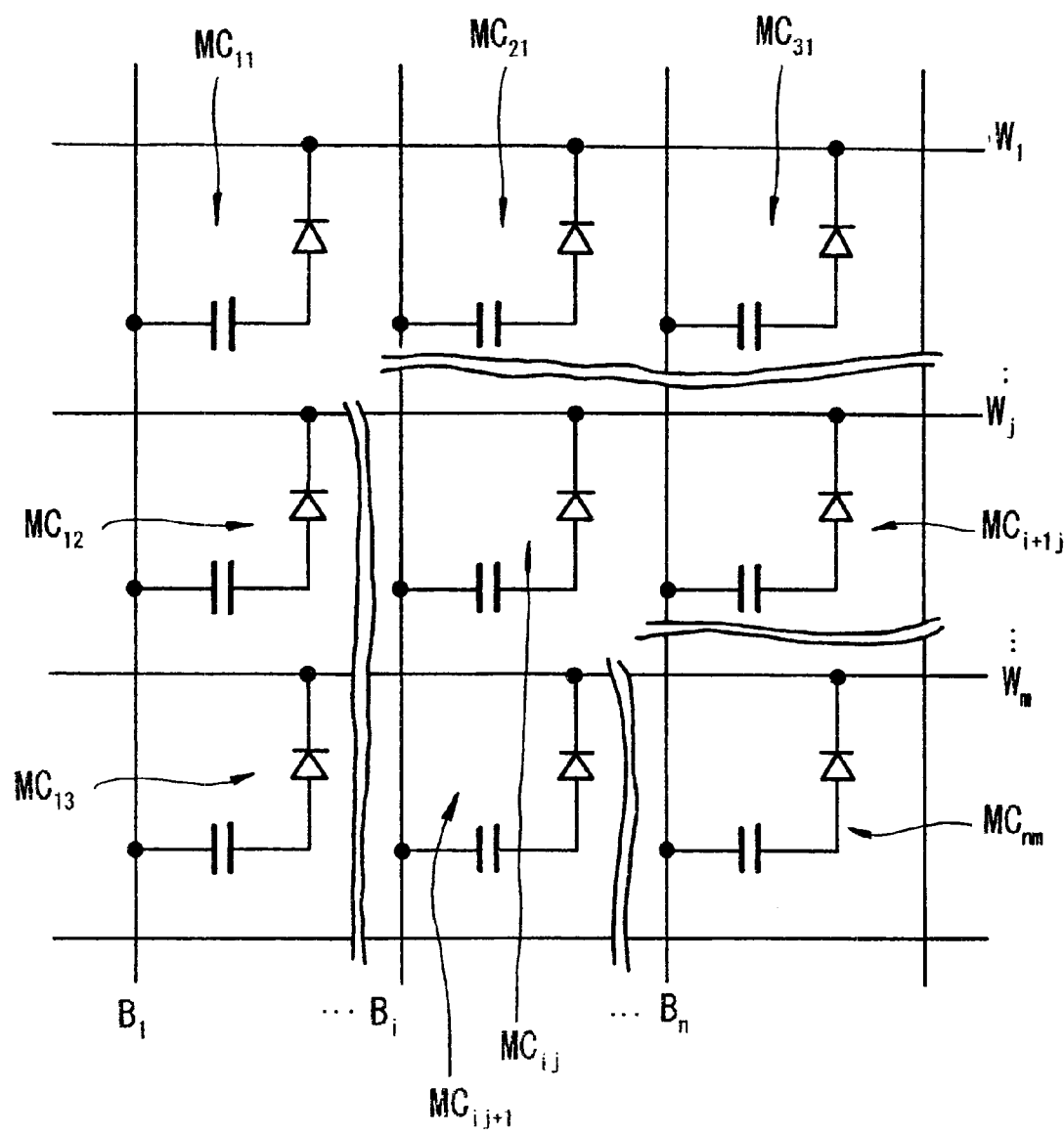
FIG. 1 is a circuit diagram that shows nonvolatile memory according to the first embodiment of the invention.

Explained below are embodiments of the invention with reference to the drawings. In all of the figures illustrating the embodiments, the same or equivalent parts or elements are labeled with common reference numerals.

FIG. 1 is a circuit diagram of a memory cell array of nonvolatile semiconductor memory according to the first embodiment of the invention.

As shown in FIG. 1, in the nonvolatile memory according to the first embodiment, memory cells made by serially connected pn diodes and capacitors are arranged in a matrix. One end of capacitors is connected to a bit line $B_i$ (i=1~n), and the other end thereof is connected to a p-side electrode of a pn diode. An n-side electrode of the pn diode is connected to a word line $W_j$ (j=1~m)

Next explained is a concrete arrangement of the nonvolatile memory according to the first embodiment.

Figure 2:
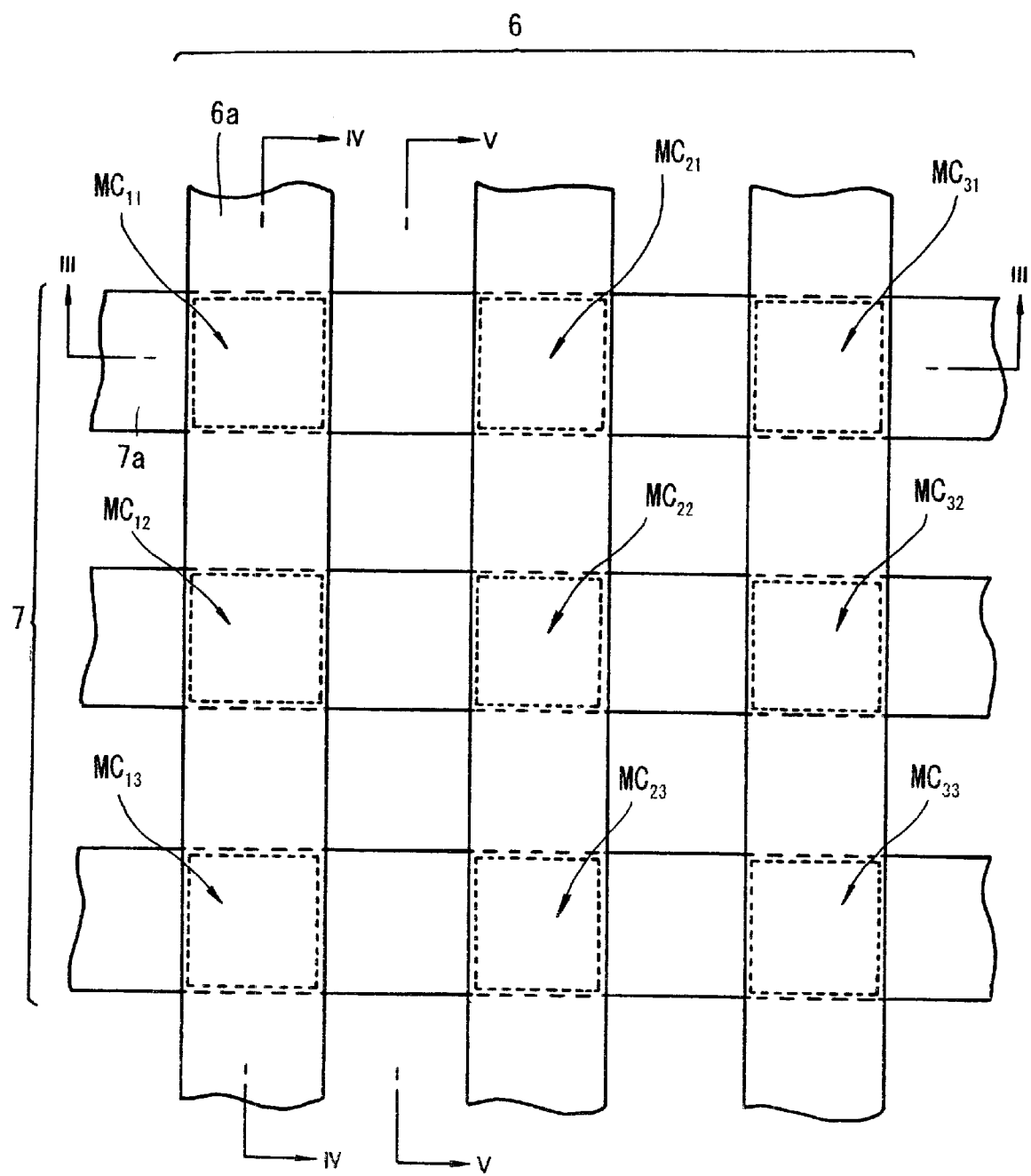
FIG. 2 is plan view that shows a partial configuration of a memory cell array of the nonvolatile memory according to the first embodiment of the invention.
Figure 3:
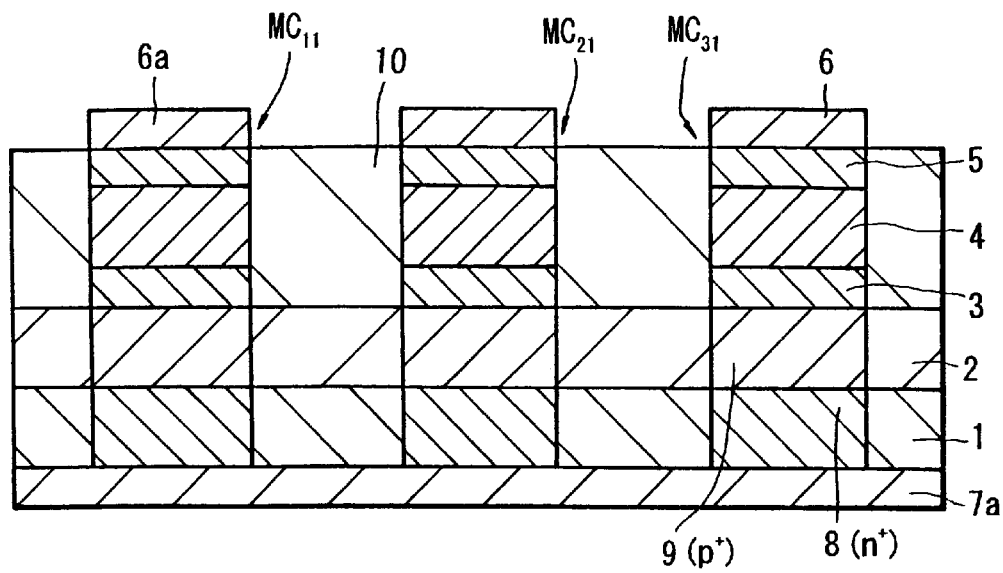
FIG. 3 is a cross-sectional view taken along the III—III line of FIG. 2.
Figure 4:
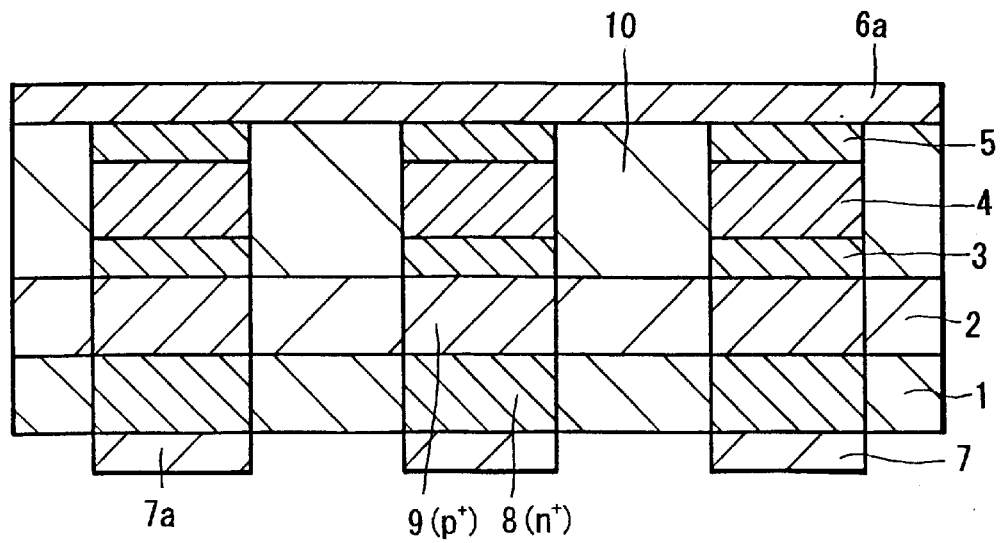
FIG. 4 is a cross-sectional view taken along the IV—IV line of FIG. 2.
Figure 5:
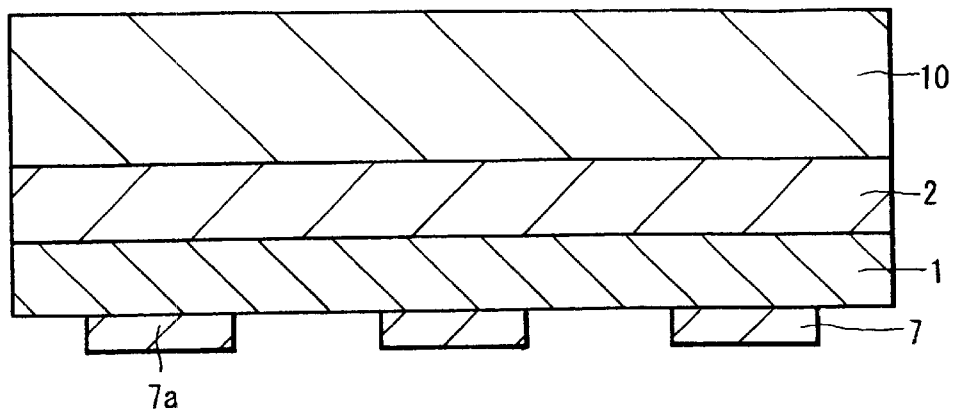
FIG. 5 is a cross-sectional view taken along the V—V line of FIG. 2.

FIG. 2 is a plan view that shows a part of the memory cell array, FIG. 3 is a cross-sectional view taken along the III—III line of FIG. 2, FIG. 4 is a cross-sectional view taken along the IV—IV line of FIG. 2, and FIG. 5 is a cross-sectional view taken along the V—V line of FIG. 2.

As shown in FIGS. 2, 3, 4 and 5, on one of surfaces of a structure stacking a first thin film semiconductor 1 and a second thin film semiconductor 2, upper electrodes 6 are formed to extend via a conductive adiabatic film 3, thin film phase change material 4 and conductive adiabatic film 5. The upper electrodes 6 and the lower electrodes 7 extend such that their lengthwise directions intersect at a right angle. The first thin film semiconductor 1 has formed $n^+$-type regions 8 in selective portions thereof where the upper electrodes 6 and the lower electrodes 7 intersect. The second thin film semiconductor 2 has formed $p^+$-type regions 9 in selective portions where the upper electrodes 6 and the lower electrodes 7 intersect. These $n^+$-type regions 8 and $p^+$-type regions 9 make up np junctions. Each np junction functions as a switching element upon applying a voltage to the thin film phase change material 4.

The first thin film semiconductor 1 and the second thin film semiconductor 2 are made of polycrystalline Si, for example. The thin film phase change material 4 is made of vanadium oxide ($V_2O_5$) or chalcogenide semiconductor like GeTeSb, for example. In this first embodiment, it is a 5 nm thick $V_2O_5$ film, for example. This $V_2O_5$ has two stable phases, namely, "low temperature phase" in which the specific resistance is 4.9 $\Omega \cdot cm$ and "high-temperature phase" in which the specific resistance is 7 $\Omega \cdot cm$.

The upper electrodes 6 and the lower electrodes 7 are required to be low in electric resistance, and are therefore made of a metal such as aluminum (Al) or copper (Cu), for example. Metal films made of Al or Cu, in general, have high thermal conductivities, and efficiently transport a current to the thin film phase change material 4 and minimize diffusion of heat generated in the thin film phase change material 4. Thus, the conductive adiabatic films 3, 5 are made of a material lower in electric resistance and thermal conductivity than the thin film phase change material 4. More specifically, the conductive adiabatic materials 3, 5 are made of a conductive oxide such as ITO (Indium Tin Oxide), zinc oxide (ZnO), or the like. In this first embodiment, it is made of ITO, for example.

Next explained is a manufacturing method of the nonvolatile memory according to the first embodiment having the above-explained configuration with reference to FIGS. 6A through 7B that are cross-sectional views corresponding to the cross-sectional view shown in FIG. 3.

Figure 6A:
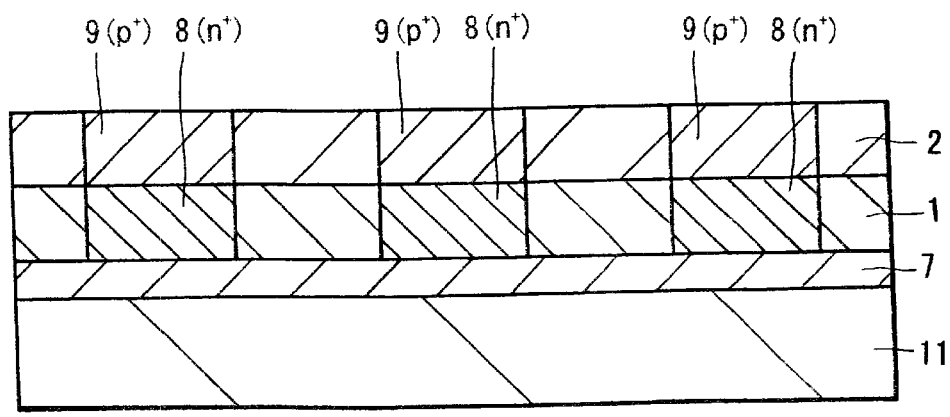
FIGS. 6A through 6C are cross-sectional views for explaining a manufacturing method of the nonvolatile memory according to the first embodiment of the invention.

First referring to FIG. 6A, Al or Cu, for example, is stacked to make a film on a support substrate 11. After that, this film is patterned into a predetermined geometry by etching to form the lower electrodes 7. Subsequently, recesses among the lower electrodes 7 are buried with a smoothing film (both the recesses and the smoothing film are not shown) to level the surface. Next formed on the leveled surface is the first thin film semiconductor 1 of polycrystalline Si, for example. Thereafter, using a resist pattern (not shown) as a mask, an n-type impurity is selectively ion-implanted into the first thin film semiconductor 1 to form the $n^+$-type regions 8. Then the second thin film semiconductor 2 is stacked on the first thin film semiconductor 1. After that, in selective portions of the second thin film semiconductor 2 above the $n^+$-type regions 8, a p-type impurity is selectively introduced, using a resist pattern (not shown), for example, as a mask to form the $p^+$-type regions 9.

Figure 6B:
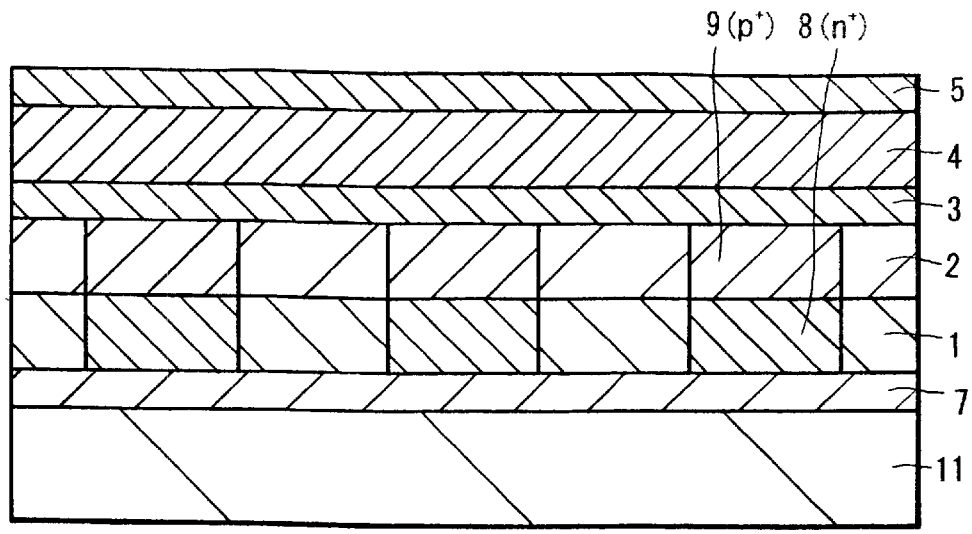

Next as shown in FIG. 6B, ITO, $V_2O_5$ and ITO are sequentially stacked on the second thin film semiconductor 2 to form a multi-layered film of a conductive adiabatic film 3 of ITO, thin film phase change material 4 of $V_2O_5$ and conductive adiabatic film 5 of ITO.

Figure 6C:
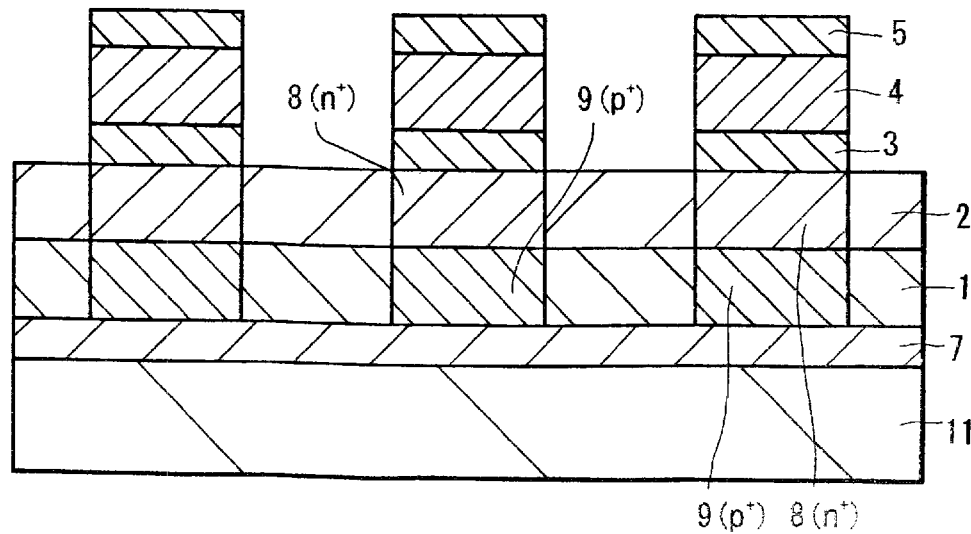

Next as shown in FIG. 6C, the conductive adiabatic film 3, thin film phase change material 4 and conductive adiabatic film 5 are patterned into the form of a plurality of memory cells each having the plane size of 0.5×0.5 $\mu$m, for example.

Figure 7A:
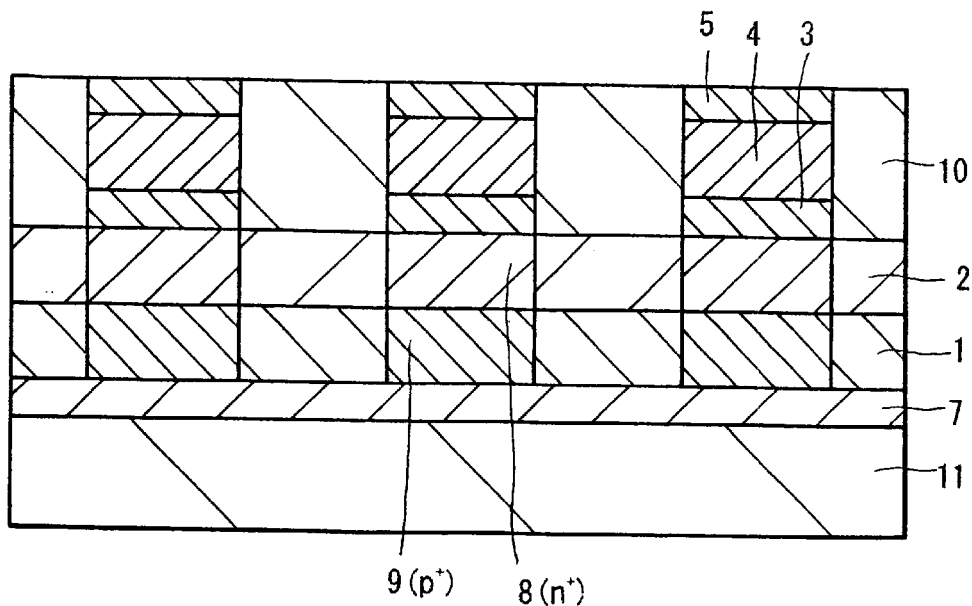
FIGS. 7A and 7B are cross-sectional views for explaining a manufacturing method of the nonvolatile memory according to the first embodiment of the invention.

Next as shown in FIG. 7A, recesses among the patterned multi-layered films of the conductive adiabatic films 3, thin film phase change material 4 and conductive adiabatic films 5 are buried with a smoothing film 10 to level the surface.

Figure 7B:
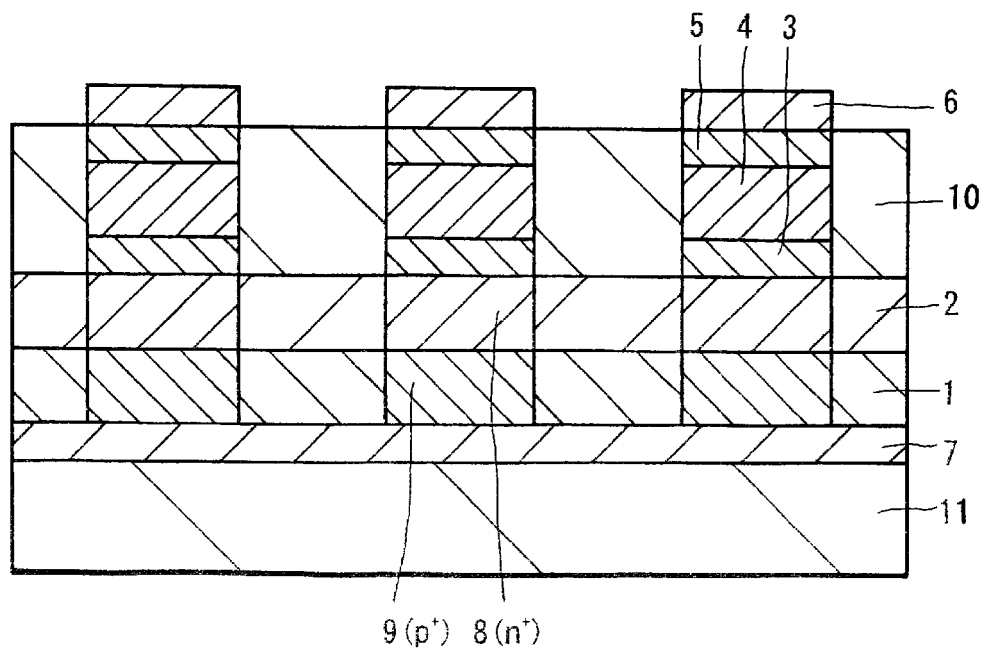

Next as shown in FIG. 7B, after a metal film of Al or Cu, for example, is stacked on the leveled surface, the upper electrodes 6 are made by patterning using etching.

After that, the smoothing film (not shown) buried in the recesses in the support substrate 11 and among the lower electrodes 7 is removed. As a result, the intended nonvolatile memory is obtained as shown in FIGS. 2, 3, 4 and 5.

Next explained is a method for erasure, writing and reading with the nonvolatile memory according to the first embodiment.

First about erasure, since writing can be done by direct overwriting by a voltage applied through the upper electrodes 6 and the lower electrodes 7 as explained later, the memory does not need the erasing process independently.

Next explained is the writing process. Assuming that $V_h$ is the voltage required for changing the phase of the thin film phase change material 4 from the "low-temperature phase" to the "high-temperature phase" without connecting the switching elements made up of the np junctions, and $V_l$ is the voltage required for changing the "high-temperature phase" to the "low-temperature phase", the following relation is established.

$$V_l < V_b$$

Figure 8:
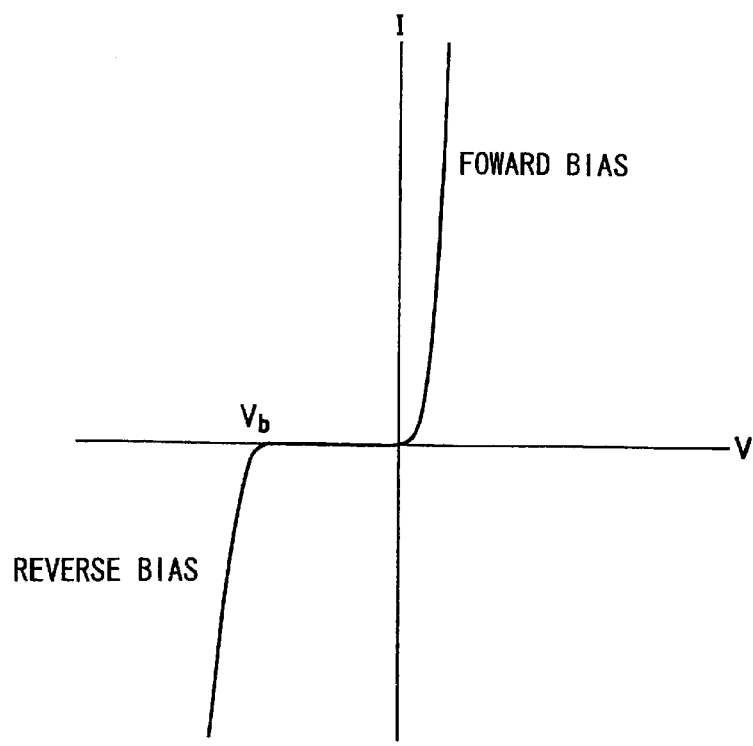
FIG. 8 is a graph that shows current-voltage characteristics of an np junction according to the first embodiment of the invention.

Further, as shown in FIG. 8, when a forward bias is applied, each np junction exhibits a low resistance, but when a reverse bias is applied, its exhibits a high resistance up to the breakdown voltage $V_b$ and a low resistance beyond the breakdown voltage $V_b$. Therefore, in the case where the np junction is connected in series with the thin film phase change material 4 and a reverse bias is applied to the np junction between the upper electrode 6 and the lower electrode 7, it is necessary that the absolute value of the voltage between the upper electrode 6 and the lower electrode 7 is higher than the breakdown voltage $V_b$.

Then, if the voltage applied to a selected memory cell is sufficiently high, and this voltage is $V_b + V_h$ (the thin film phase change material 4 is the "low-temperature phase") or $V_b + V_l$ (the thin film phase change material 4 is the "high-temperature phase"), a current enough to change the phase flows in the thin film phase change material 4, and a power is supplied to heat it. Due to this heat, the phase of the thin film phase change material 4 changes from the "high-temperature phase" to the "low-temperature phase", or from the "low-temperature phase" to the "high-temperature phase". In this manner, by adjusting the heating temperature of the thin film phase change material 4 by the current, the thin film phase change material 4 is controlled in phase.

Based on the phase control by the current, writing can be made at random. It is determined here that the "high-temperature phase" of the thin film phase change material 4 corresponds to data "1" and the "low-temperature phase" corresponds to data "0".

A review is made about writing data "1" by applying a reverse bias voltage to an np junction (reverse writing), as an example. In this case, $(V_b+V_h)/2$ is applied to an upper electrode 6a overlapping a selected memory cell $MC_{1l}$, and $-(V_b+V_h)/2$ is applied to the lower electrode 7a. Upper electrode 6 and lower electrodes 7 not overlapping the memory cell $M_{1l}$ are held in 0 V grounded. In order to prevent a current flow into memory cells $C_{i1}$ (i=2, 3, . . . n) overlapping the upper electrode 6a supplied with $(V_b+V_h)/2$ but not selected, it is necessary to establish the relation $$(V_b+V_h)/2 < V_b$$

that is, $$V_h < V_b$$

Similarly, in order to prevent a current flow in memory cells $MC_{1j}$ (j=2, 3, . . . , m) overlapping the lower electrode 7a but other than the selected memory cell $MC_{1l}$, the following relation is required to establish $$-(V_b+V_h)/2 > -V_h$$

that is, $$V_h < V_b$$

These conditions can be readily realized by optimizing the material of the thin film phase change material 4, thickness and pattern size of the thin film phase change material 4, or by optimizing the doped amounts of impurities of the $p^+$-type regions 9 and the $n^+$-type regions 8 forming the pn junctions.

Figure 9:
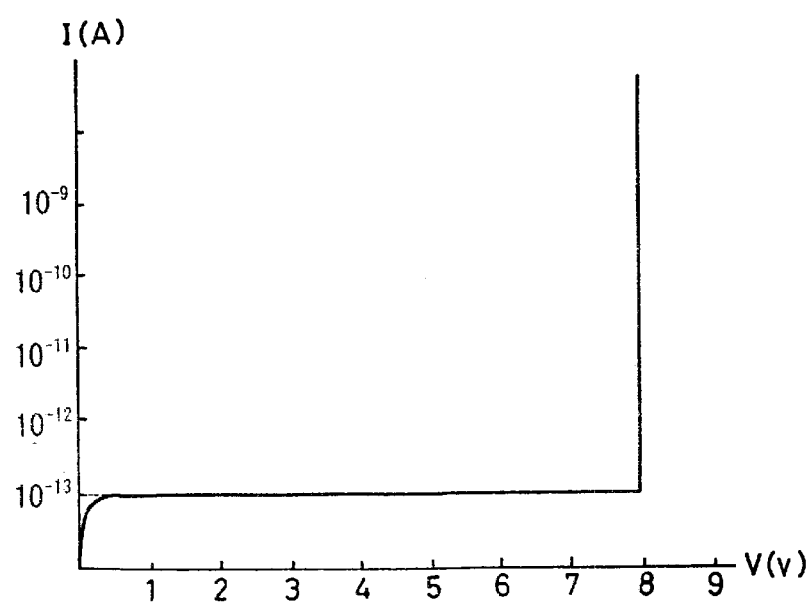
FIG. 9 is a graph that shows changes in current upon application of a reverse bias to the np junction depending upon the applied voltage in the first embodiment of the invention.

In the first embodiment, the thin film phase change material 4 is made of $V_2O_5$, adjusting its thickness to 5 nm and its plane size to 0.5 $\mu$m×0.5 $\mu$m. As a result, when the thin film phase change material 4 is in the "low-temperature phase", the resistance value is 980 $\Omega$, and when it is in the "high-temperature phase", the resistance value is 1400 $\Omega$. Power required for changing the thin film phase change material 4 from the "low-temperature phase" to the "high-temperature phase" is 50 mW, and power required for hanging it from the "high-temperature phase" to the "low-temperature phase" is 24 mW. In the np junctions in the first embodiment, the breakdown voltage $V_b$ is 8V, and in the range below 8V, the current $10^{-13}$A flows in response to application of the reverse bias (see FIG. 9).

That is, in the first embodiment, for changing the thin film phase change material 4 of the memory cell $MC_{1l}$ from the "low-temperature phase" to the "high-temperature phase" for the purpose of writing data "1" in the selected memory cell $MC_{1l}$, $-7.5$ V is applied to the upper electrode 6a, 7.5 V to the lower electrode 7, and a reverse bias to the np junction. As a result, the voltage of (7.5−(−7.5)−8=) 7V is applied to the thin film phase change material 4. At that time, the power $$7V \times 7V/980\Omega = 0.05W = 50 \text{ mW}$$

is applied to the thin film phase change material 4 in the "low-temperature phase". As a result, the thin film phase change material 4 changes from the "low-temperature phase" to the "high-temperature phase", and data "1" is written in the memory cell $MC_{1l}$. If data "1" is already written in the memory cell $MC_{1l}$, and the thin film phase change material 4 is in the "high-temperature phase", data "1" is not written in the memory cell $MC_{1l}$.

In memory cells $MC_{1l}$ (i=2, 3, . . . , n) overlapping the upper electrode 6a supplied with the voltage but other than the selected memory cell $MC_{1l}$, a reverse bias voltage of 7.5 V is applied. At that time, the current flowing in the np junction of the memory cell $MC_{1l}$ is $10^{-13}$, and power supplied to the thin film phase change material 4 is $$(10^{-13}A)^2 \times 980\Omega = 1 \times 10^{-24}W$$

Since this power value is much smaller than the power (50 mW) that can change the phase, the phase does not change, and writing into the memory cell $MC_{1l}$ is prevented. Similarly, also in memory cells $MC_{1j}$ (j=2, 3, . . . , m) overlapping the lower electrode 7a but other than the selected memory cell $MC_{1l}$, the reverse bias of 7.5 V is applied. Therefore, the same current flows, and the power supplied to the thin film phase change material 4 of the memory cell $MC_{1j}$ is $1 \times 10^{-24}W$. As a result, writing into the memory cell $MC_{1j}$ is prevented as well.

Next made is a review about writing data "0" in the selected memory cell $MC_{1j}$ by applying a reverse bias to its np junction (reverse writing). In this case, $(V_h+V_l)/2$ is applied to the upper electrode 6a overlapping the selected memory cell $MC_{1l}$, and $-(V_h+V_l)/2$ is applied to the lower electrode 7a. Upper electrodes 6 and lower electrodes 7 not overlapping the memory cell $MC_{1l}$ are held in 0 V grounded. In order to prevent that a current flows into memory cells $MC_{il}$ overlapping the upper electrode 6a supplied with $(V_h+V_1)/2$ but other than the selected memory cell $MC_{1l}$ (i=2, 3, . . . , n), it is necessary to establish the relation $$V_l < V_b$$

similarly to the change from the "low-temperature phase" to the "high-temperature phase". Also for preventing a current flow into memory cells $MC_{1j}$ (j=2, 3, . . . , m) overlapping the lower electrode 7a but other than the selected memory cell $MC_{1l}$, the relation $$V_l < V_b$$

is required to establish. These conditions can be readily realized by optimizing the material of the thin film phase change material 4, thickness and pattern size of the thin film phase change material 4, or by optimizing the doped amounts of impurities of the $p^+$-type regions 9 and the $n^+$-type regions 8 forming the pn junctions.

Still in the first embodiment, in the case where the thin film phase change material 4 of the memory cell $M_{1l}$ is changed from the "high-temperature phase" to the "low-temperature phase" for the purpose of writing data "0" in the selected memory cell $MC_{1l}$, -6.9V is applied to the upper electrode 6a and 6.9V is applied to the lower electrode 7. As a result, a reverse bias is applied to the np junction, and the thin film phase change material 4 is supplied with the voltage $$(6.9V-(-6.9V)-8V=)5.8V$$

At that time, the thin film phase change material 4 in the "high-temperature phase" is supplied with the power $$5.8V \times 5.8V/1400\Omega = 0.024W = 24 \text{ mW}$$

As a result, the thin film phase change material 4 changes from the "high-temperature phase" to the "low-temperature phase", and data "0" is written in the memory cell $MC_{1l}$. If data "0" is already written in the memory cell $MC_{1l}$ and the thin film phase change material 4 is in the "low-temperature phase", data "0" is not written in the memory cell $MC_{1l}$.

Next made is a review about writing data "1" in the selected memory cell $MC_{1l}$ by applying a forward bias to its np junction (forward writing). In this case, $V_h/2$ is applied to the upper electrode 6a, and $V_h/2$ is applied to the lower electrode 7a. As a result, the voltage of $V_h$ is applied to the thin film phase change material 4, and its phase changes from the "low-temperature phase" to the "high-temperature phase". Similarly, for changing the thin film phase change material 4 from the "high-temperature phase" to the "low-temperature phase", $V_l/2$ is applied to the upper electrode 6a, and $-V_l/2$ is applied to the lower electrode 7a.

As already explained, in the first embodiment, the thin film phase change material 4 exhibits the resistance value 980Ω in the "low-temperature phase" and 1400Ω in the "high-temperature phase". Further, it needs the power of 50 mW to change from the "low-temperature phase" to the "high-temperature phase" and 24 mW to change from the "high-temperature phase" to the "low-temperature phase". Therefore, in case of writing data "1" in the memory cell $MC_{1l}$ whose thin film phase change material 4 is in the "low-temperature phase", by applying (-7/2=) -3.5 V to the upper electrode 6a and (7/2=) 3.5 V to the lower electrode 7a, the voltage of 7V is applied to the thin film phase change material 4. By the application of this voltage, the power $$7V \times 7V/980\Omega = 0.05W = 50 \text{ mW}$$

is supplied to the thin film phase change material 4. As a result, the thin film phase change material 4 changes from the "low-temperature phase" to the "high-temperature phase", and data "1" is written into the memory cell $MC_{1l}$. In memory cells $MC_{1l}$ (i=2, 3, . . . , n) overlapping the upper electrode 7a supplied with the voltage but other than the selected memory cell $MC_{1l}$, a forward bias of 3.5 V is applied. At that time, the power supplied to the thin film phase change material 4 is $$3.5V \times 3.5V/980\Omega = 0.0125W = 12.5 \text{ mW}(<50 \text{ mW})$$

Since this power value is smaller than the power (50 mW) that can change the phase, the phase does not change, and writing into the memory cell $MC_{1l}$ is prevented. Similarly, also in memory cells $MC_{1j}$ (j=2, 3, . . . , m) overlapping the lower electrode 7a but other than the selected memory cell $MC_{1l}$, a forward bias of 3.5 V is applied, and the same current flows. As a result, the power supplied to the thin film phase change material 4 of the memory cell $MC_{1l}$ 12.5 mW, and writing into the memory cell $MC_{1j}$ is prevented as well.

For writing data "0" in the memory cell $MC_{1l}$, (-5.8V/2=) -2.9 V is applied to the upper electrode 6a, (5.8V/2=) 2.9 V to the lower electrode 7a, and 5.8 V to the thin film phase change material 4. By the application of this voltage, the thin film phase change material 4 is supplied with the power $$5.8V \times 5.8V/1400\Omega = 0.024W = 24 \text{ mW}$$

As a result, the thin film phase change material 4 changes from the "high-temperature phase" to the "low-temperature phase", and data "0" is written in the memory cell $MC_{1l}$. In memory cells $MC_{1l}$ (i=2, 3, . . . , n) overlapping the upper electrode 6a supplied with the voltage but other than the selected memory cell $MC_{1l}$, a forward bias voltage of 2.9 V is applied to the np junctions. At that time, the power supplied to the thin film phase change materials 4 in the "high-temperature phase" is $$2.9V \times 2.9V/1400\Omega \approx 0.006W = 6 \text{ mW}$$

Since this power value is smaller than the power (24 mW) that can change the phase, the phase does not change, and writing into the memory cells $MC_{1l}$ is prevented. Similarly, also in memory cells $MC_{1j}$ (j=2, 3. ..., m), a forward bias voltage of 2.9 V is applied to the np junctions, and the same current flows. As a result, the power supplied to the thin film phase change materials 4 of the memory cells $MC_{1j}$ is limited to 6 mW, and writing into the memory cells $MC_{1j}$ is prevented as well.

In that manner of writing, direct overwriting is made possible, and writing with less disturbance is attained.

Reading is performed in the following manner. For reading data from the memory cell $MC_{1l}$ for example, a voltage between $V_b/2$ and $(V_b+V_l)/2$ is applied to the upper electrode 6a overlapping the memory cell MC 11, and a voltage between $-(V_b+V_l)/2$ and $-V_b/2$ is applied to the lower electrode 7a. Upper electrodes 6 other than the upper electrode 6a and lower electrodes other than the lower electrode 7a are grounded to 0V. As a result, a current flows in the selected memory cell $MC_{1l}$ alone, and no current flows in memory cells $MC_{1j}$ other than the memory cell $MC_{1l}$.

Further, between the upper electrode 6a and the lower electrode 7a, a reverse bias in the range of $V_b$ and $(V_b+V_1)$ is applied to the np junction as the switch element. Therefore, the voltage applied to the thin film phase change material 4 becomes in the range from 0 to $V_1$, and the thin film phase change material 4 is not affected and does not change in phase. As a result, the recorded status of the memory cell $MC_{1l}$ is maintained.

More specifically, in the first embodiment, a voltage of −5V is applied to the upper electrode 6a, and 5V is applied to the lower electrode 7a. At that time, in the memory cell $MC_{1l}$, a reverse bias voltage of 10V is applied to the pn junction. Since the breakdown voltage of the np junction is 8V, the voltage of (10−8=) 2V is applied to the thin film phase change material 4. Therefore, when the current flowing in the thin film phase change material 4 is $$2V/98\Omega = 0.002A = 2 \text{ mA}$$

the thin film phase change material 4 is in the "low-temperature phase", and data written therein is read out as data "0". At that time, the power supplied to the thin film phase change material 4 is $$2V \times 2V/980\Omega \approx 0.004W = 4 \text{ mW}$$

Since this power value is smaller than the power that can change the phase of the thin film phase change material 4, the phase of the thin film phase change material 4 does not change, and the storage status is maintained. In memory cells $MC_{1l}$ and $MC_{1l}$) overlapping any of the upper electrode 6a and lower electrode 7a but other than the memory cell $MC_{1l}$, a reverse bias of 5V, in maximum, is applied, and the current flowing there is $1 \times 10^{-13}$A (see FIG. 9). therefore, under the current flowing during the reading process, selectivity of the memory cell $MC_{1l}$ relative to the memory cells $MC_{1l}$ and $C_{1j}$ becomes $2 \times 10^{10}$. As a result, cross-talk is prevented.

On the other hand, in the case where the current flowing in the thin film phase change material 4 is approximately $$2V/1400\Omega \approx 0.0014A = 1.4 \text{ mA}$$

the thin film phase change material 4 is acknowledged to be in the "high-temperature phase", and data written therein is read out as data "1". At that time, the power supplied to the thin film phase change material 4 is $$2V \times 2V/1400\Omega \approx 0.0028W = 2.8 \text{ mW}$$

Since this power value is smaller than the power that can change the phase of the thin film phase change material 4, the phase of the thin film phase change material 4 does not change, and the storage status is maintained. Applied to memory cells $MC_{1j}$ and $MC_{1l}$ overlapping only one of the upper electrode 6a and the lower electrode 7a and other than the memory cell $MC_{1l}$ is a reverse bias voltage of 5V, in maximum. Therefore, under the current flowing in the reading process, selectivity of the memory cell $MC_{1l}$ relative to the memory cells $MC_{1j}$ and $MC_{1l}$ is $1.4 \times 10^{10}$. As a result, cross-talk is prevented.

Thereafter, data can be read out from respective memory cells in the same manner. Thus, the memory can be accessed to at random also in the reading process.

As explained above, according to the first embodiment, since the nonvolatile memory is made up of a plurality of memory cells each composed of the thin film phase change material 4 having two stable phases at the room temperature and the pn junction as the switching element serially connected to the thin film phase change material 4, it is possible to control the current flowing in the thin film phase change material 4 by means of the pn Junction and change the thin film phase change material 4 between the "high-temperature phase" and the "low-temperature phase" by that current. Then, by changing the thin film phase change material 4 in phase and changing its resistance value, data writing can be done, and data reading can be done by reference to the current value corresponding to a difference in resistance value responsive to the difference in phase of the thin film phase change material 4. As a result, in nonvolatile memory using two-terminal memory cells, random access for reading and writing is made possible without inviting the problems of disturbance and cross-talk, and the memory cells structure can be simplified. Therefore, it is possible to increase the speed and integration of nonvolatile memory and reduce its manufacturing cost.

Figure 10:
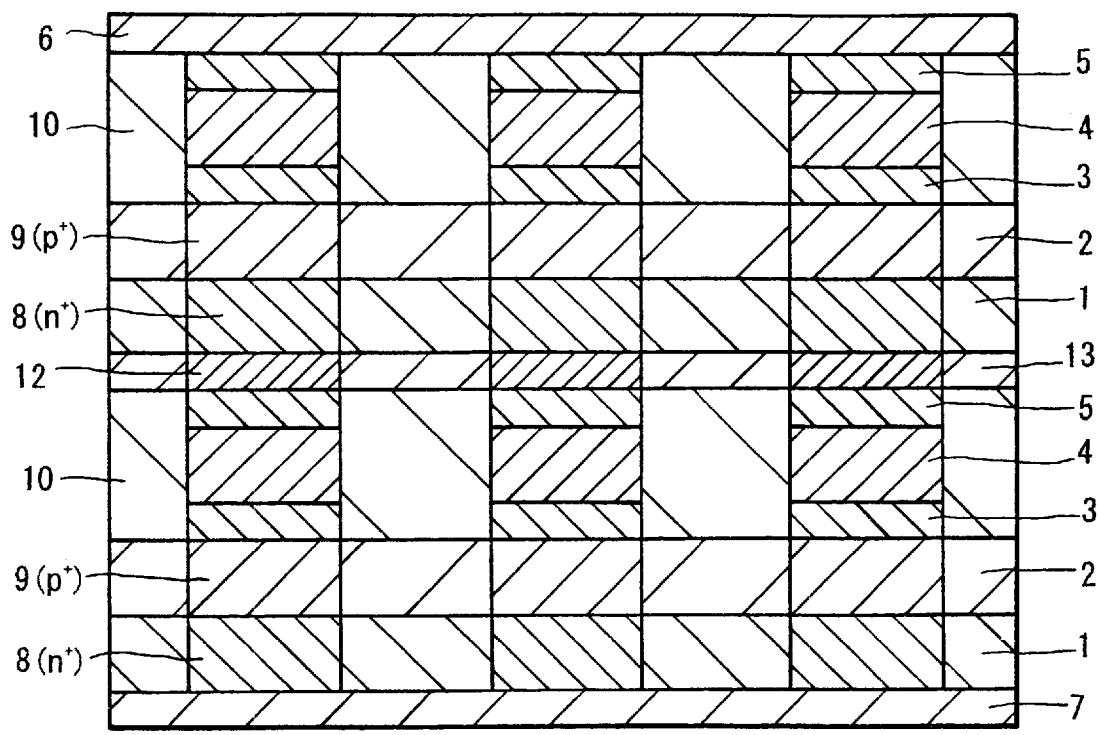
FIG. 10 is a cross-sectional view that shows an example of nonvolatile memory having a multi-layered structure according to the second embodiment of the invention.

Additionally, memory cells constituting the nonvolatile memory according to the first embodiment do not use MOS transistors using single-crystal Si, for example, unlike conventional ferroelectric memory and flash memory. Therefore, its three-dimensional structure can be readily realized. Nonvolatile memory having a three-dimensional structure is explained below as the second embodiment of the invention. FIG. 10 is a cross-sectional view of nonvolatile memory with such a multi-layered structure, and it corresponds to FIG.

As shown in FIG. 10, nonvolatile memory according to the second embodiment is made by stacking two layers of nonvolatile memory according to the first embodiment. More specifically, in the nonvolatile memory according to the second embodiment, stacked on the nonvolatile memory (first layer) as shown in FIG. 3 is the nonvolatile memory (second layer) of the same structure. No inter-layer insulating film is needed between these layers. Upper electrodes of the first layer of nonvolatile memory and lower electrodes of the second layer of nonvolatile memory are replaced with common electrodes 12. The common electrodes 12 are stripe-shaped, and spaces among the stripes of the common electrodes 12 are buried with a smoothing film 13.

According to the second embodiment, the same effects as those of the first embodiment can be obtained. In addition, the stacked structure gives the further effect of an epoch-making improvement of integration density.

Although the invention has been explained heretofore by way of specific embodiments, the invention is not limited to these embodiments but can be modified in various modes within the technical concept of the invention.

For example, numerical values, structures, configurations, materials and processes, for example, proposed and suggested in the explanation of the embodiments are not but mere examples, and any appropriate other numerical values, structures, configurations, materials and processes, for example, can be employed.

Further, the manufacturing method of the nonvolatile memory explained in the description of the first embodiment is a mere example, and any other appropriate manufacturing method may be used.

Additionally, although the first embodiment has been explained as determining the "high-temperature phase" of the thin film phase change material 4 to correspond to data "1" and the "low-temperature phase" to correspond to data "0", these relations may be reversed. That is, the "high-temperature phase of the thin film phase change material 4 may be determined to correspond to data "0" and the "low-temperature phase" may be determined to correspond to data "1".

Furthermore, in the first embodiment, the $n^+$-type regions 8 of the np junctions made by the $n^+$-type regions 8 and the $p^+$-type regions 9 are connected to the lower electrode 7. However, the $n^+$-type regions arid $p^+$-type regions are configured to make pn junctions, and $p^+$-type regions may be connected to the lower electrodes 7.

Moreover, in the first embodiment, the np junctions are located under the lower electrodes 7 and the thin film phase change materials 4 are located above the upper electrodes 6. However, it is also possible to locate np junctions or pn junctions on the upper electrodes 6 and locate the thin film phase change materials 4 under the lower electrodes 7 by changing the stacking order.

As described above, according to the invention, since nonvolatile memory is made up of memory cells each made of a thin film phase change material having at least two stable phases at the room temperature and a snitching element connected to the thin film phase change material, it is possible to realize nonvolatile memory capable of erasing, writing and reading data with memory cells having a two-terminal simple structure, reduced in disturbance, having a high integration density, and enabling high-density recording.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. Nonvolatile memory comprising memory cells each made of a thin film phase change material having at least two stable phases and a two-terminal switching element connected to said thin film phase change material,
    wherein the two-terminal switching element is an np junction, and
    wherein the thin film phase change material can be changed in phase by applying a reverse bias voltage above the breakdown voltage of the two-terminal switching element.

2. The nonvolatile memory according to claim 1 wherein information can be written in said memory cell by changing said thin film phase change material in phase.

3. The nonvolatile memory according to claim 1 wherein said thin film phase change material is changed in electric resistance in response to the current phase of said thin film phase change material.

4. The nonvolatile memory according to claim 3, wherein information can be read out from said memory cell with reference to a difference in current flowing in said thin film phase change material by applying a voltage above the breakdown voltage of said two-terminal switching element to the two-terminal switching element.

5. Nonvolatile memory comprising:
    lower electrodes aligned in form of stripes; and
    upper electrodes aligned in form of stripes such that lengthwise directions thereof intersect substantially at a right angle with lengthwise directions of said lower electrodes,
        in portions between said upper electrodes and said lower electrodes where both electrodes intersect, memory cells each made of a thin film phase change material having at least two stable phases, a conductive adiabatic layer and a two-terminal switching element serially connected thereto,
        wherein the two-terminal switching element is an np junction, and
        wherein the thin film phase change material can be changed in phase by applying a reverse bias voltage above the breakdown voltage of the two-terminal switching element.

6. The nonvolatile memory according to claim 5 wherein said conductive adiabatic layer is made of a conductive oxide.

7. The nonvolatile memory according to claim 5 wherein a plurality of layers of nonvolatile memory are stacked, each said nonvolatile memory having memory cells each including lower electrodes aligned in form of stripes, and upper electrodes aligned in form of stripes such that lengthwise directions thereof intersect substantially at a right angle with lengthwise directions of said lower electrodes, a voltage being applicable to said memory cells through said upper electrodes and said lower electrodes.

8. The nonvolatile memory according to claim 7 wherein said upper electrodes of first one of nonvolatile memory are used as lower electrodes of second one of nonvolatile memory stacked on said first one of nonvolatile memory.

9. A method for driving a nonvolatile memory including lower electrodes aligned in a form of stripes; upper electrodes aligned in a form of stripes such that lengthwise directions thereof intersect substantially at a right angle with lengthwise directions of said lower electrodes; and memory cells each comprising a thin film phase change material having at least two stable phases, a conductive adiabatic layer, and an np junction two-terminal switching element serially connected thereto and each located in a portion between said upper electrodes and said lower electrodes where both electrodes intersect, characterized in that:
    in a writing process, data is written in a selected memory cell by applying a reverse bias voltage above a total value of a breakdown voltage of the selected memory cell's two-terminal switching element and a voltage capable of changing the phase of the selected memory cell's thin film phase change material between an upper electrode of said upper electrodes and a lower electrode of said lower electrodes connected to the selected memory cell and thereby changing said thin film phase change material in phase, and in a reading process, data is read out by applying a reverse bias voltage not lower than said breakdown voltage and lower than a total value of said breakdown voltage and said voltage capable of changing the phase of said thin film phase change material, and thereby reading a current phase of said thin film phase change material.

* * * * *